(12) United States Patent
Weimer

(10) Patent No.: US 7,833,692 B2
(45) Date of Patent: Nov. 16, 2010

(54) AMINE-ARRESTING ADDITIVES FOR MATERIALS USED IN PHOTOLITHOGRAPHIC PROCESSES

(75) Inventor: Marc W. Weimer, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 322 days.

(21) Appl. No.: 12/043,623

(22) Filed: Mar. 6, 2008

(65) Prior Publication Data

US 2009/0011361 A1 Jan. 8, 2009

Related U.S. Application Data

(60) Provisional application No. 60/894,398, filed on Mar. 12, 2007.

(51) Int. Cl.
G03F 7/00 (2006.01)
G03F 7/004 (2006.01)
G03F 7/26 (2006.01)
G03F 7/40 (2006.01)

(52) U.S. Cl. .......... 430/270.1; 430/273.1; 430/311; 430/315; 430/330; 430/331; 430/927

(58) Field of Classification Search .......... 430/273.1, 430/270.1, 311, 330, 331, 315, 927
See application file for complete search history.

(56) References Cited

U.S. PATENT DOCUMENTS

| | | | | |
|---|---|---|---|---|
| 6,114,085 A * | 9/2000 | Padmanaban et al. | ..... | 430/270.1 |
| 6,228,757 B1 * | 5/2001 | Sengupta et al. | ..... | 438/622 |
| 6,242,161 B1 * | 6/2001 | Kawaguchi et al. | ..... | 430/313 |
| 6,465,148 B1 * | 10/2002 | Kang et al. | ..... | 430/270.1 |
| 6,583,047 B2 * | 6/2003 | Daniels et al. | ..... | 438/623 |
| 6,596,467 B2 * | 7/2003 | Gallagher et al. | ..... | 430/314 |
| 6,645,864 B1 | 11/2003 | Lin et al. | | |
| 6,939,661 B2 * | 9/2005 | Kang et al. | ..... | 430/270.1 |
| 2002/0198333 A1 * | 12/2002 | Puligadda et al. | ..... | 525/533 |
| 2004/0099954 A1 | 5/2004 | Chen et al. | | |
| 2005/0095841 A1 | 5/2005 | Chen et al. | | |
| 2006/0093844 A1 * | 5/2006 | Conklin et al. | ..... | 428/500 |
| 2007/0020557 A1 | 1/2007 | Yao et al. | | |
| 2007/0048458 A1 * | 3/2007 | Haruta et al. | ..... | 428/1.31 |
| 2007/0059913 A1 | 3/2007 | King et al. | | |

FOREIGN PATENT DOCUMENTS

EP 1035147 A1 * 9/2000

OTHER PUBLICATIONS

Moore J., et al., "Characterizing etch residue removal from low-K ILD structures using aqueous and non-aqueous chemistries," Proceedings-Electrochemical Society, 2003-26(Cleaning Technology in Semiconductor Device Manufacturing VIII), pp. 340-347, ISSN: 0161-6374, published in 2004.
Bayer Material Science Desmocap Product Datasheets, 8 pages.
Bayer Material Science Desmodur Product Datasheets, 6 pages.
Baxenden Chemicals Ltd Blocked Isocyanates Product Datasheets, 8 pages.

* cited by examiner

Primary Examiner—Amanda C. Walke
(74) Attorney, Agent, or Firm—Hovey Williams LLP

(57) ABSTRACT

Novel, poison-blocking compositions and methods of using those compositions to form poison-blocking layers are provided. The compositions comprise a typical composition used in microlithographic processes, but with a poison-blocking additive included in that composition. The preferred additive is a compound comprising one or more blocked isocyanates. Upon heating to certain temperatures, the blocking group is released from the isocyanate, leaving behind a moiety that is highly reactive with the poisonous amines generated by typical dielectric layers.

47 Claims, 1 Drawing Sheet

AMINE-ARRESTING ADDITIVES FOR MATERIALS USED IN PHOTOLITHOGRAPHIC PROCESSES

RELATED APPLICATIONS

The present invention claims the benefit of U.S. Provisional Application No. 60/894,398, filed Mar. 12, 2007, entitled Amine-Arresting Additives for Materials Used in Photolithographic Processes, incorporated by reference herein.

FEDERALLY SPONSORED RESEARCH/DEVELOPMENT PROGRAM

This invention was made with U.S. Government support under DASG60-01-C-0047 awarded by the US Army Space and Missile Defense Command. The U.S. Government has certain rights in the invention.

BACKGROUND OF THE INVENTION

1. Field of the Invention

The present invention is broadly concerned with novel coatings that inhibit, and preferably prevent, poisoning by amines released from a dielectric material.

2. Description of the Prior Art

In the field of microelectronic device manufacturing, integration of porous low-k, interlayer dielectrics (ILD) into devices has created situations where the materials or the processing residuals release basic amines. These amines neutralize the photogenerated acid of a photoresist, which, after photolithographic imaging, leaves areas undeveloped or underdeveloped. These low-fidelity images are highly detrimental to the creation of the device because they will degrade device performance or stability and, in some cases, render the device unusable. Left uncontrolled, ILD integration becomes difficult if not impossible. Preventing amines from entering the resist is paramount to the economical creation of the most advanced integrated circuits.

Preventing amine poisoning has not been fully addressed by any process. Several attempts have been made with varying degrees of success. Barrier layers have been used to cap substrates that contain poison. However these barriers are intentionally breached in subsequent processing and allow for local release of poisoning amines. There have been reports of using wet clean or plasma pretreatments to neutralize or destroy the amines prior to the addition of the resist. Although these processes effectively remove the poison, they introduce other steps into the process flow, add expense, or detrimentally affect the properties of the device. Acid neutralization of the base by the application of organic films is not always effective because typical bottom anti-reflective coating technology uses an acid catalyst for the cure and does not prevent poisoning. Furthermore the neutralization is a reversible process whereby the amine may be released during later processing.

SUMMARY OF THE INVENTION

The present invention is broadly concerned with a method of inhibiting or preventing amine poisoning. The method comprises providing a composition comprising a compound dissolved or dispersed in a solvent system, where the compound comprises a blocked isocyanate. The composition is formed as a layer on or adjacent a dielectric material.

In one embodiment, a novel anti-reflective composition is provided. The composition comprises a crosslinkable monomer, oligomer, and/or polymer and a chromophore dispersed or dissolved in a solvent system, with the composition further comprising a compound comprising a blocked isocyanate.

In another embodiment, a novel spin-on carbon composition is provided. The composition comprises a monomer, oligomer, and/or polymer dispersed or dissolved in a solvent system. The composition comprises at least about 75% carbon atoms, based upon the total number of atoms in all the solids in the composition taken as 100%. Furthermore, the composition comprises a compound comprising a blocked isocyanate.

The present invention is also directed towards a microelectronic structure comprising a microelectronic substrate and a layer of dielectric material on or adjacent that substrate. The structure further comprises a poison-inhibiting layer on or adjacent the dielectric material. The poison-inhibiting layer is formed from a composition comprising a compound dissolved or dispersed in a solvent system, with the compound comprising a blocked isocyanate.

DETAILED DESCRIPTION OF THE PREFERRED EMBODIMENTS

Figure 1:
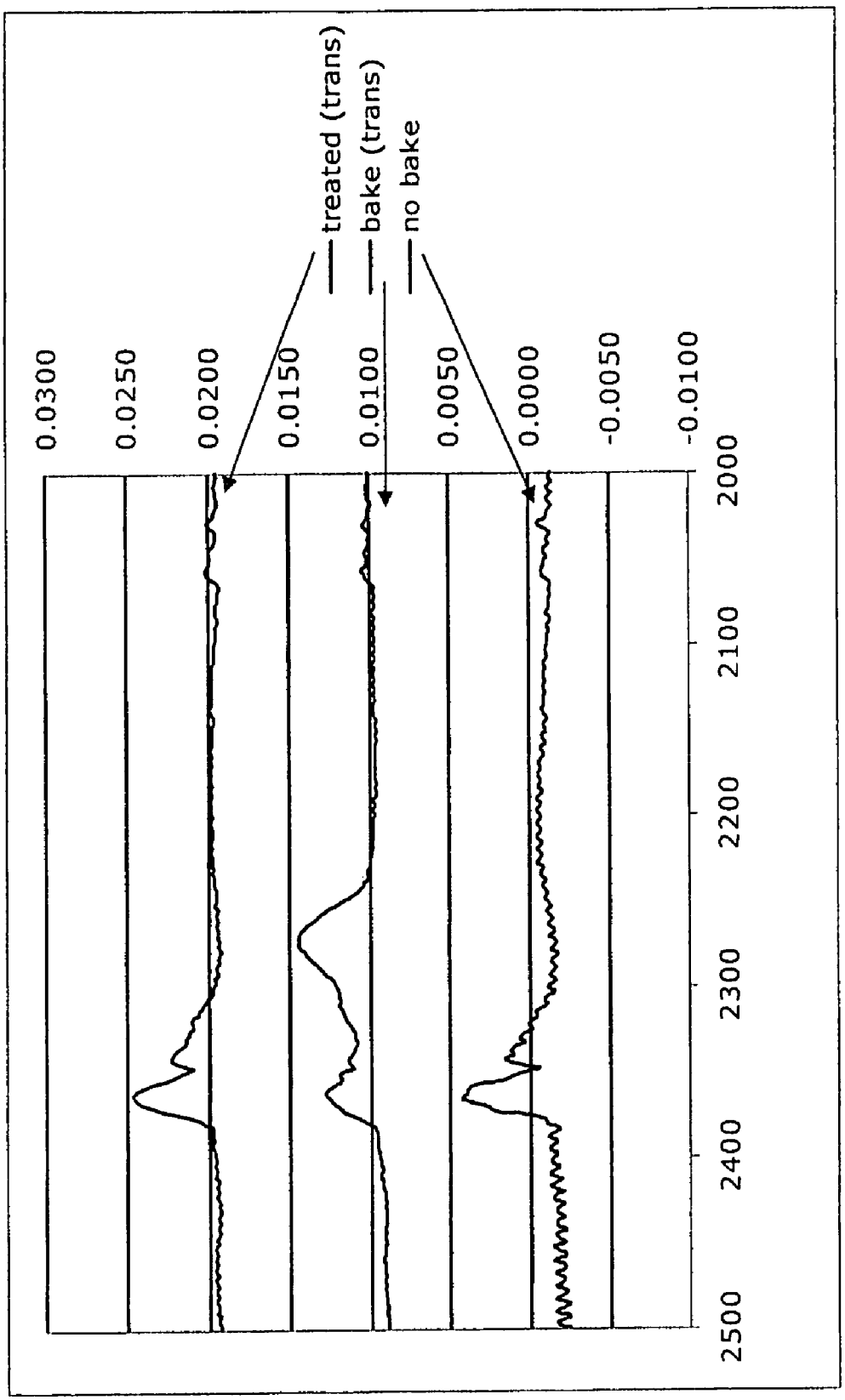
FIG. 1 is a graph showing the FTIR spectra of the composition of Example 1.

The present invention is concerned with novel, poison-inhibiting compositions and methods of substantially (and preferably completely) inhibiting poisoning caused by amines released during photolithographic processing and/or from underlayers, such as dielectric layers. The methods involve the use of an additive in a composition that would normally be used in a fabrication process. These compositions typically include a polymer, oligomer, and/or monomer dispersed or dissolved in a solvent system. Such compositions include anti-reflective compositions, gap fill compositions, spin-on carbon compositions, and spin-on hard mask compositions.

When the composition is an anti-reflective composition, the polymer, oligomer, and/or monomer is preferably crosslinkable. Preferred polymers can be linear or branched, and include those selected from the group consisting of polyacrylates, polyesters, polyepoxides, poly(epoxy novolacs), polysaccharides, polyethers, polyimides, polyurethanes, polystyrenes, polyamic acids, polysulfones, and mixtures thereof. Preferred monomers and oligomers include substituted and unsubstituted forms of those selected from the group consisting of styrenes, methacrylates, epoxy novolacs, and mixtures thereof. The polymer, oligomer, and/or monomer are typically included in the composition at levels of from about 40% to about 100% by weight, and more preferably from about 75% to about 90% by weight, based upon the total weight of solids in the composition taken as 100% by weight.

The anti-reflective composition also comprises a chromophore or light attenuating compound. The chromophore can be separately mixed into the composition, or it can be provided as a group or moiety on the polymer, oligomer, and/or monomer. In either instance, preferred chromophores include substituted and unsubstituted chromophores selected from the group consisting of thiophenes, naphthoic acid, anthracene, naphthalene, benzene, chalcone, phthalimides, pamoic acid, acridine, azo compounds, dibenzofuran, isocyanurates, barbituric acid, pyridine, furans, ureas, thioureas, and mixtures thereof. The chromophore is typically included in the composition at levels of from about 10% to about 95% by weight, and more preferably from about 40% to about 80% by weight, based upon the total weight of solids in the composition taken as 100% by weight.

The anti-reflective composition would also typically comprise a crosslinking agent. The crosslinking agent can be separately mixed into the composition, or it can be provided as a group or moiety on the polymer, oligomer, and/or monomer. Preferred crosslinking agents include those selected from the group consisting of aminoplasts, epoxies, glycourils, vinyl ethers, and mixtures thereof. The crosslinking agent is preferably included in the composition at levels of from about 5% to about 50% by weight, and more preferably from about 15% to about 25% by weight, based upon the total weight of the solids in the composition taken as 100% by weight.

The anti-reflective composition preferably also comprises a catalyst, which can be an acid or a thermal acid generator (TAG). Preferred catalysts include those selected from the group consisting of p-toluenesulfonic acid, pyridine p-toluenesulfonic acid, sulfosalicylic acid, and mixtures thereof. A preferred TAG is sold under the name TAG-2689 from King industries. The catalyst is typically included in the composition at levels of from about 0.1% to about 5% by weight, and more preferably from about 1% to about 3% by weight, based upon the total weight of the solids in the composition taken as 100% by weight.

The anti-reflective composition can also include a number of optional ingredients, including those selected from the group consisting of surfactants, adhesion promoters, quenchers, photoacid generators (PAGs), and mixtures thereof. The use of a PAG is particularly desirable when a photosensitive (i.e., one that can be patterned upon exposure to light at the wavelengths described herein) anti-reflective coating is desired. In these instances, the PAG should be included in the composition at levels of from about 0.1% to about 10% by weight, and more preferably from about 1% to about 5% by weight, based upon the total weight of the solids in the composition taken as 100% by weight. Any PAG that produces an acid in the presence of light is suitable. Preferred PAGs include onium salts (e.g., triphenyl sulfonium perfluorosulfonates such as triphenyl sulfonium nonaflate and triphenyl sulfonium triflate), oxime-sulfonates (e.g., those sold under the name CGI® by CIBA), and triazines (e.g., TAZ108® available from Midori Kagaku Company).

All of the above ingredients are dissolved or dispersed in a solvent system. Preferred solvent systems have a boiling point of from about 100° C. to about 220° C., and more preferably from about 115° C. to about 145° C. Suitable solvents include those selected from the group consisting of methyl isoamyl ketone, di(ethylene glycol) dimethyl ether, propylene glycol monomethyl ether acetate, ethyl lactate, cyclohexanone, propylene glycol monomethyl ether, γ-butyrolactone, and mixtures thereof. The solvent system is preferably included in the composition at levels of from about 80% to about 99% by weight, and more preferably from about 90% to about 98% by weight, based upon the total weight of the composition taken as 100% by weight.

The anti-reflective composition can be spin-coated followed by crosslinking at temperatures of from about 100° C. to about 250° C., and preferably from about 160° C. to about 210° C. to form a cured film having a thickness of from about 20 nm to about 500 nm, and preferably from about 30 nm to about 300 nm. The resulting films have a k value of at least about 0.10, and preferably from about 0.10 to about 0.60 at wavelengths of about 365 nm and smaller (e.g., 157 nm 193 nm, 248 nm, 365 nm). The resulting films have an n value of at least about 1.2, and preferably from about 1.5 to about 2.0 at wavelengths of about 365 nm and smaller (e.g., 157 nm 193 nm, 248 nm, 365 nm).

Finally, the cured films will be substantially insoluble in typical photoresist solvents (e.g., ethyl lactate) as measured by a Film Stripping Test. In this test, a 4-inch silicon wafer is coated with the particular anti-reflective coating formulation followed by baking at about the cure temperature of the composition for 60 seconds. The film thickness is then measured at five locations using a Stokes ellipsometer, and the average of these measurements is considered the initial average film thickness. The wafer is then sprayed with ethyl lactate. The resulting puddle is allowed to stand on the wafer for 10 seconds followed by spin-drying of the wafer at 3,500 rpm for 20 seconds. The wafer is then remeasured at five locations with a Stokes ellipsometer to determine the film thickness, and the average of these measurements is considered the final average film thickness. The amount of stripping is the difference between the initial and final average film thickness measurements. The percent stripping is $$\% \text{ stripping} = \left(\frac{\text{amount of stripping}}{\text{initial average film thickness}}\right) \times 100.$$

Preferred anti-reflective compositions will give a percent stripping of less than about 10%, preferably less than about 5%, and preferably about 0%.

In embodiments where the composition is a spin-on carbon composition, preferred polymers include those selected from the group consisting of poly(epoxy cresol novolacs), polystyrenes, polynaphthalenes, polyacrylates, polyimides, and mixtures thereof. Preferred monomers and oligomers can be substituted and unsubstituted and include those selected from the group consisting of styrene, vinyl naphthalenes, methacrylates, vinyl pyridines, and mixtures thereof. The polymer, oligomer, and/or monomer should be provided at sufficient levels so that the carbon levels in the composition are at least about 75% carbon atoms, preferably at least about 80% carbon atoms, and even more preferably from about 80% to about 95% carbon atoms, based upon the total number of atoms in all the solids in the composition taken as 100%. One having ordinary skill in the art can readily calculate this percentage based upon the chemical structure of the solids included in the composition. Alternatively, the carbon atom and total atom contents can be analyzed and calculated using known analytical equipment, including x-ray fluorescence spectroscopy, auger spectroscopy, and secondary ion mass spectroscopy. To achieve these carbon atom levels, the polymer, oligomer, and/or monomer are typically included in the composition at levels of from about 3% to about 15% by weight, and more preferably from about 5% to about 10% by weight, based upon the total weight of solids in the composition taken as 100% by weight.

The spin-on composition would also typically comprise a crosslinking agent. The crosslinking agent can be separately mixed into the composition, or it can be provided as a group or moiety on the polymer, oligomer, and/or monomer. Preferred crosslinking agents include those selected from the group consisting of aminoplasts, epoxies, glycourils, vinyl ethers, and mixtures thereof. The crosslinking agent is typically included in the composition at levels of from about 5% to about 40% by weight, and more preferably from about 10% to about 25% by weight, based upon the total weight of the solids in the composition taken as 100% by weight.

The spin-on carbon composition preferably also comprises a catalyst, such as an acid or a thermal acid generator (TAG). Preferred catalysts include those selected from the group consisting of p-toluenesulfonic acid, pyridine p-toluenesulfonic acid, sulfosalicylic acid, and mixtures thereof. The catalyst is preferably included in the composition at levels of from about 0.01% to about 1% by weight, and more preferably from about 0.1% to about 0.2% by weight, based upon the total weight of the solids in the composition taken as 100% by weight.

The spin-on carbon composition can also include a number of optional ingredients, such as those selected from the group consisting of surfactants, adhesion promoters, quenchers, PAGs, and mixtures thereof. If a PAG is utilized, the same examples and quantities discussed above with respect to antireflective compositions would also apply to spin-on carbon compositions.

All of the above ingredients are dissolved or dispersed in a solvent system. Preferred solvent systems have a boiling point of from about 100° C. to about 200° C., and more preferably from about 115° C. to about 145° C. Suitable solvents include those selected from the group consisting of methyl isoamyl ketone, di(ethylene glycol) dimethyl ether, propylene glycol monomethyl ether acetate, ethyl lactate, cyclohexanone, propylene glycol monomethyl ether, γ-butyrolactone, and mixtures thereof. The solvent system is preferably included in the composition at levels of from about 80% to about 99% by weight, and more preferably from about 85% to about 95% by weight, based upon the total weight of the composition taken as 100% by weight.

The spin-on carbon composition can be spin-coated followed by baking at temperatures of from about 100° C. to about 250° C., and preferably from about 160° C. to about 210° C. to form a cured film having a thickness of from about 100 nm to about 500 nm, and preferably from about 150 nm to about 300 nm. The resulting films etch slowly in reactive ion etching processes, and, in particular, they etch sufficiently slow that they can be used as an etch mask to transfer patterns to a substrate.

Furthermore, the final spin-on carbon films are highly planar and can be used to obtain low bias films. Specifically, the layers will have biases of less than about 80 nm, preferably less than about 65 nm, more preferably less than about 50 nm, and even more preferably from about 0-35 nm. Furthermore, this bias will be achieved with layers having average thicknesses of less than about 100 nm, preferably less than about 80 nm, and more preferably less than about 70 nm.

As used herein, the average thickness of a layer is determined by measuring (with an ellipsometer or other conventional device) the thickness of a layer at a point about halfway between two via holes: (1) that are not separated from one another by an intervening feature; and (2) whose boundaries are within 1,000 nm of one another. These measurements are repeated over a wafer (or other area as defined herein) 49 times, and the measurements are averaged to determine the average thickness of a layer.

As used herein, the bias is determined by subtracting the average thickness of a layer over a dense region from the average thickness of that same layer over an isolated region. A dense region is defined as a portion of a substrate that has at least about 50% of its surface area filled with features such as via holes, while an isolated region is defined as a portion of a substrate that has less than about 20% of its surface area filled with features such as via holes.

Regardless of which type of composition is utilized, the poison-inhibiting additive is simply added to that composition without the need to alter other aspects of the composition.

The preferred additive is a compound that comprises a blocked isocyanate. As used herein, a "blocked isocyanate" refers to an isocyanate moiety where the hydrogen that would typically be bonded with the carbon of the isocyanate's carbonyl group has been replaced with another group that prevents that carbon from reacting until the desired stage in the process. The preferred blocked isocyanate has the formula

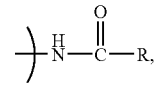

where R comprises a moiety that will separate from the compound when exposed to temperatures of at least about 100° C., and more preferably from about 140° C. to about 180° C., after a time period of less than about 60 seconds, and more preferably from about 10 seconds to about 30 seconds. Preferred R groups includes those selected from the group consisting of diethyl malonate, methyl ethyl ketoxime, 3,5-dimethyl pyrazole, and ∈-caprolactam, which has the structure

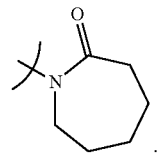

The additive compound can be a monomer, oligomer, or polymer, so long as it comprises a blocked isocyanate. If the additive is a monomer or oligomer, it is preferred that the monomer or oligomer comprise at least 2, and preferably at least 3, such blocked isocyanates. If the additive is a polymer, it is preferred that the polymer include recurring monomers that comprise at least 2, and preferably at least 3, blocked isocyanates. Regardless of the additive compound utilized, it is preferably used at sufficient levels to achieve a blocked isocyanate (not including the weight contributed by the blocking group or R) content of at least about 0.01% by weight, preferably at least about 0.05% by weight, and more preferably from about 0.1% by weight to about 0.5% by weight blocked isocyanate, based upon the total weight of the composition to which it is added taken as 100% by weight.

The inventive methods involve applying the poison-inhibiting composition at its normal location in the process. That is, in conventional processes, a dielectric layer is formed on a microelectronic substrate such as those selected from the group consisting of silicon, aluminum, tungsten, tungsten silicide, gallium arsenide, gallium nitride, germanium, tantalum, tantalum nitrite, SiGe, silicon dioxide, silicon nitride, aluminum oxide, glass, and quartz. The dielectric layer might be formed directly on the substrate, or it might be formed on other layers that have first been formed on the substrate (e.g., gate, contact, etch stop layers). The dielectric layer and any other layers are formed according to conventional processes.

Dielectric layers are those that have a dielectric constant of less than about 3.8. Examples of dielectric layers include those selected from the group consisting of fluorinated silicate glass, amorphous-fluorinated carbon, fluorinated polyimides, fluorinated polyarylene ethers, and parylene-F.

After the dielectric layer has been applied, the remaining layers of the process would then be formed, including the imaging layer or photoresist layer, with the additive being incorporated into one of the layers between the dielectric layer and the imaging layer so that poisonous amines are prevented from passing through and contacting the photoresist layer. Thus, the inventive composition is applied either directly on the dielectric layer, or on intermediate layers (e.g., anti-reflective layers) that have first been applied to the dielectric layer.

A significant advantage of the present process is that the conventional processes need not be altered except to add the blocked isocyanate to one of the compositions between the dielectric layer and the imaging layer. Regardless of which layer contains the composition, that layer will be heated to appropriate temperatures for solvent removal and crosslinking, as is appropriate for the particular layer. At temperatures mentioned previously, the blocking group or R group on the blocked isocyanate will then be released from the isocyanate to form the structure

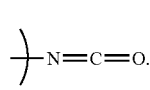
(I)

During the fabrication process, the dielectric layer will generate amines that will contact the poison-inhibiting layer and will react with structure (I) above to form non-reactive, non-basic (and preferably even slightly acidic) compounds. This reaction should yield structures having the formula

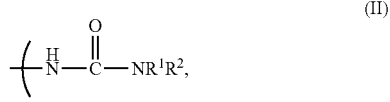
(II)

where each of $R^1$ and $R^2$ is individually selected from the group consisting of organic substituents and —H. The organic substituents are formed from residual compounds that would be released by the substrates and/or other layers in the process, depending upon the particular process being employed.

The photoresist layer will be applied and patterned according to conventional processes. This typically involves spin-applying a photoresist composition followed by baking at temperatures of from about 100° C. to about 140° C., and preferably from about 120° C. to about 130° C. to form a photoresist layer having a thickness of from about 90 nm to about 300 nm, and preferably from about 100 nm to about 150 nm. The photoresist layer can then be patterned at wavelengths of about 365 nm and shorter (e.g., 157 nm, 193 nm, 248 nm, 365 nm) followed by transferring the patterns to the underlying layers and substrate. It will be appreciated that the invention avoids the problems previously associated with amine poisoning, including poor patterns, by blocking the amines from ever contacting the photoresist layer. This results in fewer defects and improved yield.

EXAMPLES

The following examples set forth preferred methods in accordance with the invention. It is to be understood, however, that these examples are provided by way of illustration and nothing therein should be taken as a limitation upon the overall scope of the invention.

Example 1

Poison-Blocking Spin-On Carbon Material

In this procedure, 0.45 gram of DESMODUR® BL 3272 MPA (obtained from Bayer) was mixed with 40 grams of spin-on carbon material (a composition that gives 78% carbon atoms in a cast film, available from Brewer Science Inc.) to prepare the poison-blocking composition. DESMODUR® BL 3272 MPA is a caprolactone blocked polyisocyanate based on hexamethlyene diisocyanate.

The composition was then coated onto a double-sided, polished wafer to form a film. Fourier transform infrared (FTIR) spectroscopy was used to determine how effectively the isocyanate reacted with amines in the film. FTIR spectra showed a notable lack of a peak at 2280 wavenumbers, which corresponds to the absorbance of free isocyanate (see FIG. 1). Upon contact baking at 205° C. for 60 seconds, the peak at 2280 wavenumbers appeared, which is evidence of effective deblocking and activation of the isocyanate functionality. After the film was exposed to ammonia vapor, this peak quickly disappeared, an indication of the reaction between the ammonia gas and the isocyanate functionality in the film.

Example 2

Poison-Blocking Bottom Anti-Reflective Coating

In this procedure, 0.17 gram of DESMODUR®BL 3272 MPA was mixed with 30 grams of ARC®81 (an anti-reflective coating available from Brewer Science Inc) to form the poison-blocking composition.

The composition described above was spin-coated onto silicon wafers at 1,500 rpm for 60 seconds, followed by baking at 205° C. for 60 seconds. The layer was then coated with a resist (JSR 1682J, available from JSR Micro, Inc., Japan) by spinning at 1,500 rpm for 60 seconds. The resist was soft-baked at 120° C. for 60 seconds. Lithography was performed on the coated and control (i.e., same anti-reflective coating without the blocked isocyanate additive) silicon wafers to determine the effect of the additive on lithography. Specifically, the wafers were patterned with 80-nm features using light at a wavelength of 193 nm.

As viewed under a scanning electron microscope, the lithographic performance of the bottom anti-reflective coating with the additive and without was indistinguishable, which indicates that the additive had no detrimental effect on the lithography.

I claim:

1. A method of inhibiting or preventing amine poisoning, said method comprising:
   providing a composition comprising:
      a component selected from the group consisting of monomers, oligomers, and polymers;
      a crosslinking agent; and
      a compound dissolved or dispersed in a solvent system, said compound comprising a blocked isocyanate;
   forming a first layer of said composition on or adjacent a dielectric material; and
   heating said composition so as to crosslink said component with said crosslinking agent and to deblock said isocyanate to yield a deblocked isocyanate for inhibiting or preventing said amine poisoning.

2. The method of claim 1, wherein said heating yields a cured film, said method further comprising:
   optionally forming one or more layers of other compositions on said cured film; and applying an imaging layer to said cured film or to said optional layers, wherein said deblocked isocyanate reacts with an amine from said dielectric material to thereby inhibit or prevent said amine poisoning.

3. The method of claim 1, wherein said compound comprises at least two blocked isocyanates.

4. The method of claim 1, wherein said blocked isocyanate has the formula

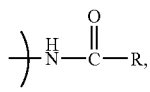

wherein R comprises a moiety that will separate from the compound when exposed to temperatures of at least about 100° C.

5. The method of claim 4, wherein R is selected from the group consisting of diethyl malonate, methyl ethyl ketoxime, 3,5-dimethyl pyrazole, and c-caprolactam.

6. The method of claim 1, wherein said dielectric material has a dielectric constant of less than about 3.8.

7. The method of claim 1, wherein said dielectric material is selected from the group consisting of fluorinated silicate glass, amorphous-fluorinated carbon, fluorinated polyimides, fluorinated polyarylene ethers, and parylene-F.

8. The method of claim 1, wherein said composition is an anti-reflective composition having a k value of at least about 0.10.

9. The method of claim 1, wherein said composition is a spin-on carbon composition.

10. The method of claim 9, wherein said spin-on carbon composition comprises at least about 75% carbon atoms, based upon the total number of atoms in all the solids in the composition taken as 100%.

11. The method of claim 9, wherein said spin-on carbon composition comprises a polymer and a catalyst dispersed or dissolved in the solvent system, said:
polymer being selected from the group consisting of poly (epoxy cresol novolacs), polystyrenes, polynaphthalenes, polyacrylates, polyimides, and mixtures thereof; and
catalyst being selected from the group consisting of p-toluenesulfonic acid, pyridine p-toluenesulfonic acid, sulfosalicylic acid, and mixtures thereof.

12. The method of claim 1, wherein said heating comprises baking said first layer at a temperature of at least about 100° C., wherein said baking converts the blocked isocyanate to a deblocked isocyanate having the formula

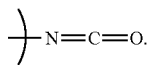

13. The method of claim 12, wherein said baking yields a cured film, said method further comprising:
optionally forming one or more layers of other compositions on said cured film; and
applying an imaging layer to said cured film or to said optional layers, wherein said deblocked isocyanate reacts with an amine from said dielectric material to thereby inhibit or prevent said amine poisoning.

14. The method of claim 13, wherein said reacting forms a product having the formula

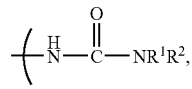

where each of $R^1$ and $R^2$ is individually selected from the group consisting of organic substituents and —H.

15. The method of claim 1, wherein said crosslinking agent is present in said composition at a level of at least about 10% by weight, based upon the total weight of the solids in the composition taken as 100% by weight.

16. The method of claim 1, wherein said crosslinking agent is present in said composition at a level of from about 10% to about 25% by weight, based upon the total weight of the solids in the composition taken as 100% by weight.

17. The method of claim 1, wherein said crosslinking agent is present in said composition at a level of from about 15% to about 25% by weight, based upon the total weight of the solids in the composition taken as 100% by weight.

18. The method of claim 1, wherein said composition comprises a blocked isocyanate content of from about 0.1% by weight to about 0.5% by weight blocked isocyanate, based upon the total weight of the composition to which it is added taken as 100% by weight.

19. The method of claim 1, wherein said blocked isocyanates form deblocked isocyanates having the formula:

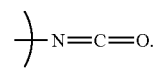

20. In an anti-reflective composition comprising a crosslinkable monomer, oligomer, or polymer, a crosslinking agent, and a chromophore dispersed or dissolved in a solvent system, the improvement being that said composition further comprises a compound comprising a blocked isocyanate, said composition having a blocked isocyanate content of from about 0.1% by weight to about 0.5% by weight blocked isocyanate, based upon the total weight of the composition taken as 100% by weight, and wherein said crosslinking agent is present in said composition at a level of at least about 10% by weight, based upon the total weight of the solids in the composition taken as 100% by weight.

21. The composition of claim 20, wherein said chromophore is bonded with said monomer, oligomer, or polymer.

22. The composition of claim 20, said composition further comprising a catalyst.

23. The composition of claim 20, wherein said composition as a k value of at least about 0.10.

24. The composition of claim 20, wherein said compound comprises at least two blocked isocyanates.

25. The composition of claim 20, wherein said blocked isocyanate has the formula

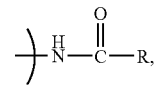

wherein R comprises a moiety that will separate from the compound when exposed to temperatures of at least about 100° C.

26. The composition of claim 25, wherein R is selected from the group consisting of diethyl malonate, methyl ethyl ketoxime, 3,5-dimethyl pyrazole, and c-caprolactam.

27. The composition of claim 20, wherein said crosslinkable monomer, oligomer, or polymer is a polymer selected from the group consisting of polyacrylates, polyesters, polyepoxides, poly(epoxy novolacs), polysaccharides, polyethers, polyimides, polyurethanes, polystyrenes, polyamic acids, polysulfones, and mixtures thereof.

28. The composition of claim 20, wherein said chromophore is selected from the group consisting of thiophenes, naphthoic acid, anthracene, naphthalene, benzene, chalcone, phthalimides, pamoic acid, acridine, azo compounds, dibenzofuran, isocyanurates, barbituric acid, pyridine, furans, ureas, thioureas, and mixtures thereof.

29. In a spin-on carbon composition comprising: a monomer, oligomer, or polymer dispersed or dissolved in a solvent system; and at least about 75% carbon atoms, based upon the total number of atoms in all the solids in the composition taken as 100%, the improvement being that said composition further comprises a compound comprising a blocked isocyanate.

30. The composition of claim 29, wherein said monomer, oligomer, or polymer is a polymer, and said composition further comprises a catalyst dispersed or dissolved in the solvent system, said:
polymer being selected from the group consisting of poly(epoxy cresol novolacs), polystyrenes, polynaphthalenes, polyacrylates, polyimides, and mixtures thereof; and
catalyst being selected from the group consisting of p-toluenesulfonic acid, pyridine p-toluenesulfonic acid, sulfosalicylic acid, and mixtures thereof.

31. The composition of claim 29, wherein said compound comprises at least two blocked isocyanates.

32. The composition of claim 29, wherein said blocked isocyanate has the formula

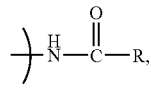

wherein R comprises a moiety that will separate from the compound when exposed to temperatures of at least about 100° C.

33. The composition of claim 32, wherein R is selected from the group consisting of diethyl malonate, methyl ethyl ketoxime, 3,5-dimethyl pyrazole, and ε-caprolactam.

34. A microelectronic structure comprising:
a microelectronic substrate;
a layer of dielectric material on or adjacent said substrate; and
a cured, poison-inhibiting layer on or adjacent said layer of dielectric material, said poison-inhibiting layer being formed from a composition comprising:
a component selected from the group consisting of monomers, oligomers, and polymers;
a crosslinking agent; and
a compound dissolved or dispersed in a solvent system, said compound comprising a blocked isocyanate,
wherein said cured layer comprises said component crosslinked with said crosslinking agent, said cured layer further comprising deblocked isocyanates for inhibiting or preventing amine poisoning.

35. The structure of claim 34, further comprising an imaging layer on or adjacent said cured, poison-inhibiting layer.

36. The structure of claim 34, wherein said compound comprises at least two blocked isocyanates.

37. The structure of claim 34, wherein said blocked isocyanate has the formula

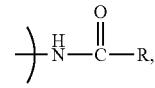

wherein R comprises a moiety that will separate from the compound when exposed to temperatures of at least about 100° C.

38. The structure of claim 37, wherein R is selected from the group consisting of diethyl malonate, methyl ethyl ketoxime, 3,5-dimethyl pyrazole, and ε-caprolactam.

39. The structure of claim 34, wherein said dielectric material has a dielectric constant of less than about 3.8.

40. The structure of claim 34, wherein said dielectric material is selected from the group consisting of fluorinated silicate glass, amorphous-fluorinated carbon, fluorinated polyimides, fluorinated polyarylene ethers, and parylene-F.

41. The structure of claim 34, wherein said composition is an anti-reflective composition having a k value of at least about 0.10.

42. The structure of claim 34, wherein said composition is a spin-on carbon composition.

43. The structure of claim 42, wherein said spin-on carbon composition comprises at least about 75% carbon atoms, based upon the total number of atoms in all the solids in the composition taken as 100%.

44. The structure of claim 42, wherein said spin-on carbon composition comprises a polymer and a catalyst dispersed or dissolved in the solvent system, said:
polymer being selected from the group consisting of poly(epoxy cresol novolacs), polystyrenes, polynaphthalenes, polyacrylates, polyimides, and mixtures thereof; and
catalyst being selected from the group consisting of p-toluenesulfonic acid, pyridine p-toluenesulfonic acid, sulfosalicylic acid, and mixtures thereof.

45. The structure of claim 34, wherein said cured, poison-inhibiting layer comprises deblocked isocyanates having the formula

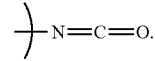

46. The structure of claim 34, wherein said cured, poison-inhibiting layer comprises modified compounds having the formula

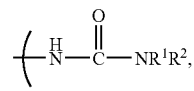

where each of $R^1$ and $R^2$ is individually selected from the group consisting of organic substituents and —H.

47. The structure of claim 34, wherein said cured, poison-inhibiting layer comprises isocyanates reacted with amines.

* * * * *